United States Patent
Hong et al.

(10) Patent No.: US 10,700,047 B2
(45) Date of Patent: Jun. 30, 2020

(54) PANEL WITH A NOTCH ACCOMMODATING A COMPONENT, DISPLAY APPARATUS INCLUDING THE SAME, AND METHOD OF MANUFACTURING THE SAME

(71) Applicant: LG DISPLAY CO., LTD., Seoul (KR)

(72) Inventors: Ju Ik Hong, Gumi-si (KR); Jeong Kweon Park, Paju-si (KR); Sang Ryeon Park, Gumi-si (KR); Yong Soo Kim, Gyeongsangbuk-do (KR); Jang Cheol Kim, Paju-si (KR); Ik Hyun Kuon, Gyeongsangbuk-do (KR)

(73) Assignee: LG DISPLAY CO., LTD., Seoul (KR)

( * ) Notice: Subject to any disclaimer, the term of this patent is extended or adjusted under 35 U.S.C. 154(b) by 16 days.

(21) Appl. No.: 14/867,297

(22) Filed: Sep. 28, 2015

(65) Prior Publication Data
US 2016/0093596 A1    Mar. 31, 2016

(30) Foreign Application Priority Data

Sep. 30, 2014  (KR) .................. 10-2014-0132085
Sep. 30, 2014  (KR) .................. 10-2014-0132089

(51) Int. Cl.
| | |
|---|---|
| H01L 25/16 | (2006.01) |
| H01L 27/12 | (2006.01) |
| H01L 25/00 | (2006.01) |
| G02F 1/1333 | (2006.01) |
| G02F 1/133 | (2006.01) |
| G02F 1/1339 | (2006.01) |

(52) U.S. Cl.
CPC ...... *H01L 25/167* (2013.01); *G02F 1/133308* (2013.01); *H01L 25/50* (2013.01); *H01L 27/124* (2013.01); *H01L 27/1248* (2013.01); *H01L 27/1262* (2013.01); *G02F 1/1339* (2013.01); *G02F 2001/13312* (2013.01); *G02F 2001/133314* (2013.01); *G02F 2001/133322* (2013.01); *H01L 2924/0002* (2013.01)

(58) Field of Classification Search
CPC ..... H01L 25/167; H01L 25/50; H01L 27/124; H01L 27/1248; H01L 27/1262; G02F 1/133308

See application file for complete search history.

(56) References Cited

U.S. PATENT DOCUMENTS

| | | | |
|---|---|---|---|
| 2007/0126945 A1 | 6/2007 | Tashiro | |
| 2012/0105400 A1* | 5/2012 | Mathew | H04N 5/2251 345/207 |
| 2012/0206669 A1* | 8/2012 | Kim | G06F 1/1686 349/58 |
| 2014/0063406 A1 | 3/2014 | Park et al. | |

FOREIGN PATENT DOCUMENTS

| | | |
|---|---|---|
| CN | 101980079 A | 2/2011 |
| JP | 08-129166 A | 5/1996 |
| JP | 2014-81653 A | 5/2014 |

(Continued)

*Primary Examiner* — Matthew E. Gordon
(74) *Attorney, Agent, or Firm* — Dentons US LLP

(57) ABSTRACT

Disclosed are a display apparatus, where a component disposition area facing a component disposed on a lower end of a non-display area of a panel is removed in a lower substrate configuring the panel, and a method of manufacturing the same.

9 Claims, 11 Drawing Sheets

(56) References Cited

FOREIGN PATENT DOCUMENTS

| KR | 10-2011-0119364 A | 11/2011 |
|---|---|---|
| KR | 10-2012-0106103 A | 9/2012 |
| KR | 10-2013-0027335 | 3/2013 |
| KR | 10-2014-0030704 A | 3/2014 |
| WO | 2006/016463 A1 | 2/2006 |

* cited by examiner

PANEL WITH A NOTCH ACCOMMODATING A COMPONENT, DISPLAY APPARATUS INCLUDING THE SAME, AND METHOD OF MANUFACTURING THE SAME

CROSS-REFERENCE TO RELATED APPLICATIONS

This application claims the benefit of the Korean Patent Application No. 10-2014-0132085 filed on Sep. 30, 2014, and Korean Patent Application No. 10-2014-0132089 filed on Sep. 30, 2014, which are hereby incorporated by reference for all purposes as if fully set forth herein.

BACKGROUND OF THE INVENTION

Field of the Invention

The present invention relates to a display apparatus and a method of manufacturing the same. More particularly, the present invention relates to a display apparatus, where at least one component such as a camera, a printed circuit board (PCB), and/or the like is provided in a non-display area, and a method of manufacturing the same.

Discussion of the Related Art

A flat panel display (FPD) apparatus is applied to various electronic devices such as portable phones, tablet personal computers (PCs), notebook computers, etc. Examples of the FPD apparatus include liquid crystal display (LCD) apparatuses, plasma display panels (PDPs), organic light emitting display apparatuses, etc. Recently, electrophoretic display (EPD) apparatuses are being widely used as one type of the FPD apparatus.

In such FPD apparatuses (hereinafter simply referred to as a display apparatus), the LCD apparatuses are apparatuses that display an image by using the optical anisotropy of liquid crystal. The LCD apparatuses have good features such as thinness, lightness, low consumption power, high image quality, etc., and thus are being widely used.

In the display apparatuses, the organic light emitting display apparatuses use a self-emitting device, and thus have a fast response time, high emission efficiency, high luminance, and a broad viewing angle. Therefore, the organic light emitting display apparatuses are attracting much attention as next-generation FPD apparatuses.

Recently, in terms of technology and design interesting to consumers, recently, research and development of display apparatuses are increasingly required. Particularly, efforts are being continuously made to minimize the thicknesses of display devices.

FIG. 1 is an exemplary diagram schematically illustrating a cross-sectional view of a related art display apparatus with a built-in camera. In particular, FIG. 1 illustrates the part where the camera is placed in the display apparatus.

The related art display apparatus with the built-in camera, as illustrated in FIG. 1, includes a guide panel 5, a panel 9 and a camera 6. The display apparatus depicted in FIG. 1 may be a liquid crystal display (LCD) apparatus, in which the panel 9 used in the display apparatus includes a lower substrate 3 and an upper substrate 2 bonded to each other. The guide panel 5 is provided with the supporting part(s) 7 protruded vertically upward from the planar bottom part 8 of the guide panel 5. The supporting part(s) 7 of the guide panel 5 supports the lower substrate 3 of the panel 9, and creates a space (e.g., cavity) between the lower substrate 3 of the panel 9 and the planar bottom part 8 of the guide panel 5. The camera 6 is disposed in the space created by the supporting part of the guide panel 5.

The total thickness of the display apparatus is the sum of the thickness of the panel 9 and the thickness of the guide panel 5.

In addition to the thickness of the planar bottom part 8, the thickness "Z" of the structures placed above the planar bottom part 8 counts toward the total thickness of the display apparatus. For example, the thickness "Z" of the structures on the planar bottom part 8 includes the thickness "Y" of panel 9. The thickness "Y" of the panel 9 may be about 0.5 mm, in which each of the upper substrate 2 and the lower substrate 3 of the panel 9 may be about 0.25 mm thick. Also, included in the thickness "Z" is the thickness "X" of the supporting part 7 of the guide panel 5. The thickness "X" of the supporting part 7 may be equal to the thickness "X1" of the camera 6, or longer than the thickness "X1" of the camera 6 by the distance "X2", which may exist between the camera 6 and the panel 9.

As such, in the related art display apparatus, the thickness "X" of the supporting part 7 increases the total thickness of the display apparatus. The thickness of the panel 9 may also affect the optical characteristics of the camera 6 (e.g., exposure, aperture, etc.). Panel can be formed thinner to have less effect on the optical characteristics of the built-in camera. The built-in camera can also be formed thinner to reduce the total thickness of the display apparatus. At some point, however, there will be a limit as to how thin the panels and built-in cameras can be.

SUMMARY OF THE INVENTION

Accordingly, the present invention is directed to provide a display apparatus and a method of manufacturing the same that substantially obviate one or more problems due to limitations and disadvantages of the related art.

An aspect of the present invention is directed to provide a display apparatus, in which a portion of a lower substrate in a panel corresponding to a component disposition area is notched to accommodate a component disposed at the component disposition area.

In one embodiment, a display apparatus is provided with a panel with a plurality of display pixels. The panel has a lower substrate and an upper substrate. A plurality of gate lines and a plurality of data lines intersecting the plurality of gate lines are arranged on the lower substrate of the panel. Each display pixels is provided in a pixel area, which is defined by the intersections of the plurality of gate lines and the plurality of data lines. The upper substrate is arranged on the lower substrate, such that at least some part of the upper substrate and the lower substrate overlap each other. The portion of the lower substrate overlapping with the upper substrate has a notch that exposes a part of the upper substrate. The notch of the lower substrate accommodates a component of the display apparatus. In other words, a component of the display apparatus is at least partially positioned in the notched are of the lower substrate. Placing a component in the notched area of the lower substrate enables to reduce the total thickness of the display apparatus.

In some embodiments, the notch of the lower substrate exposing a portion of the upper substrate is in the non-display area of the panel.

In some embodiments, the notch is fully enclosed within the non-display area of the panel such that the entire outer edge of the notch is surrounded by the remaining part of the lower substrate corresponding to the non-display area of the panel.

In some embodiments, the component accommodated in the notch of the lower substrate is a camera. Without the notch, the upper substrate would be provided larger than the lower substrate and the camera would have been placed under the extra portion of the upper substrate to receive light without interference by the lower substrate. With the notched portion in the lower substrate, however, the camera can assess the upper substrate without being interfered by the lower substrate. Accordingly, the upper substrate needs not be provided larger than the lower substrate, and this allows to reduce the bezel size of the display apparatus.

Another aspect of the present invention is related to a method of manufacturing a display apparatus, which has a panel provided with a notch in a lower substrate of the panel for accommodating a component of the display apparatus. A plurality of pixels is formed in a panel according to a plurality of pixel areas defined by a plurality of gate lines and a plurality of data lines formed on a lower substrate. An upper substrate is placed on the lower substrate such that the upper substrate and the lower substrate at least partially overlap each other. A portion of the lower substrate corresponding is notched, and a component of the display apparatus is placed with the notched area of the lower substrate.

In one embodiment, the notch is formed by removing a component disposition area of the lower substrate facing a component disposed in a non-display area with a drill.

In one embodiment, the notch is formed by removing a component disposition area of the lower substrate facing a component disposed in a non-display area with laser.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

It is to be understood that both the foregoing general description and the following detailed description of the present invention are exemplary, and they are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Reference will now be made in detail to the exemplary embodiments of the present invention, examples of which are illustrated in the accompanying drawings. Wherever possible, the same reference numbers will be used throughout the drawings to refer to the same or like parts.

Hereinafter, exemplary embodiments of the present invention will be described in detail with reference to the accompanying drawings.

Various devices such as notebook computers, tablet personal computers (PCs), smartphones, etc. includes a display apparatus. In addition to the display apparatus, various other kinds of components, such as a camera, an antenna and a printed circuit board, are included in the device. When assembling the device, some components of the device can be placed behind a panel of the display apparatus. In the present disclosure, embodiments are described in relation to a device with a camera placed behind a panel of the display apparatus for convenience. However, it should be appreciated that the present invention is not limited to such case, and may be applicable to a device having various other types of components placed behind the panel of the display apparatus.

Figure 2:
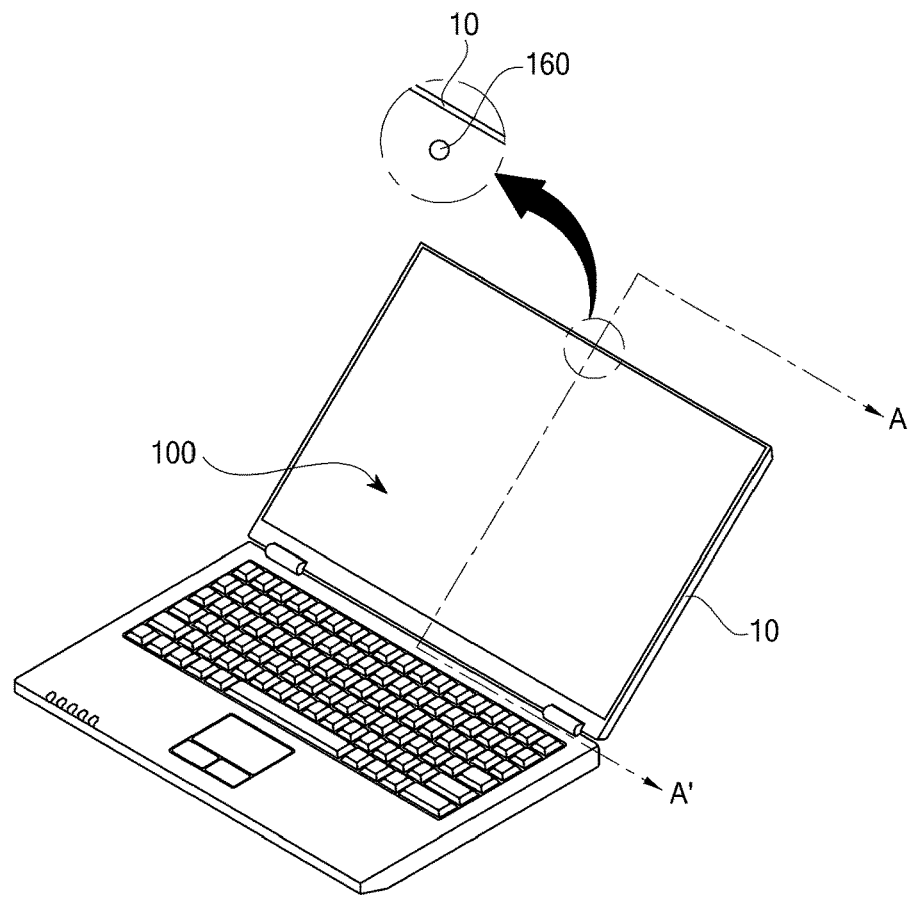
FIG. 2 is an exemplary device which a display apparatus according to an embodiment of the present invention can be provided.

Referring to FIG. 2, a display apparatus 100 can be covered by a set cover 10 of a device. A component, for example the camera 160, may be disposed behind a panel of the display apparatus 100. The camera 160 may be positioned at the upper central non-display area as shown in FIG. 2 or other parts of the non-display area of the display apparatus 100. Components other than camera 160 can disposed behind the panel in the display area. In the present disclosure, a camera is used as an example of the component to be disposed in a notch 151A of the lower substrate 151. However, it should be noted that the component, which may be disposed in the notch 151A of the lower substrate 151, is not limited as such, and various other kinds of components used in the display apparatus may be placed within the notch 151A. For instance, a drive integrated circuit chip (e.g., gate driver, display data driver, touch sensor driver, etc.) may be placed within the notch 151A.

Figure 3:
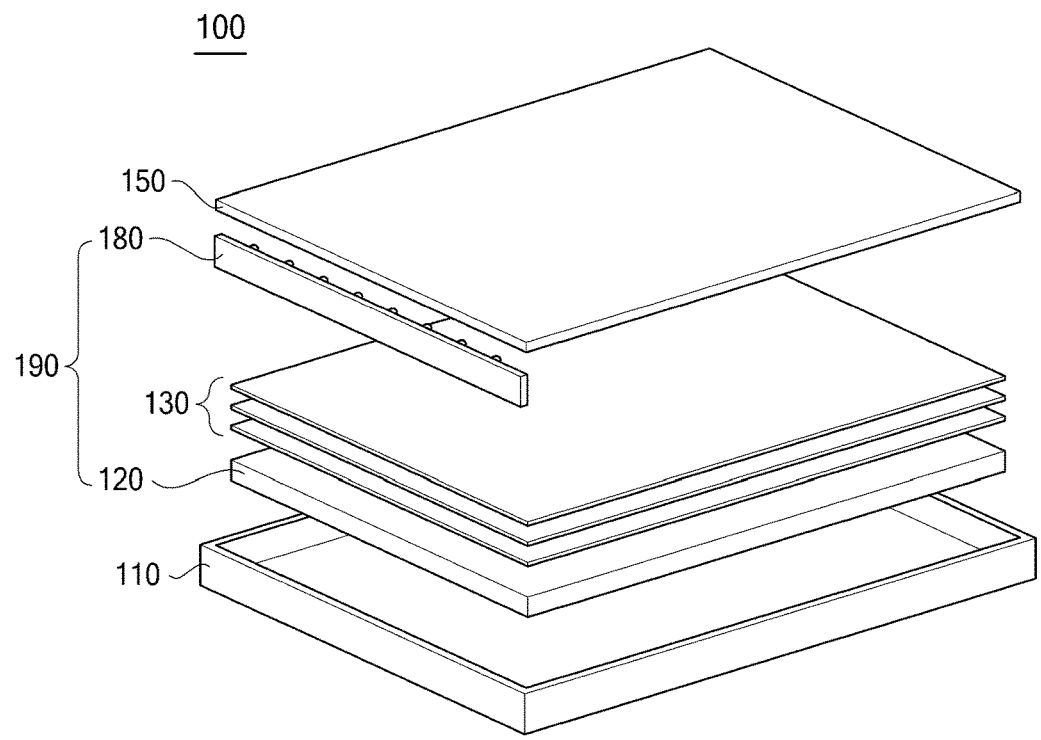
FIG. 3 is an exploded perspective view of a display apparatus according to an embodiment of the present invention.
Figure 4:
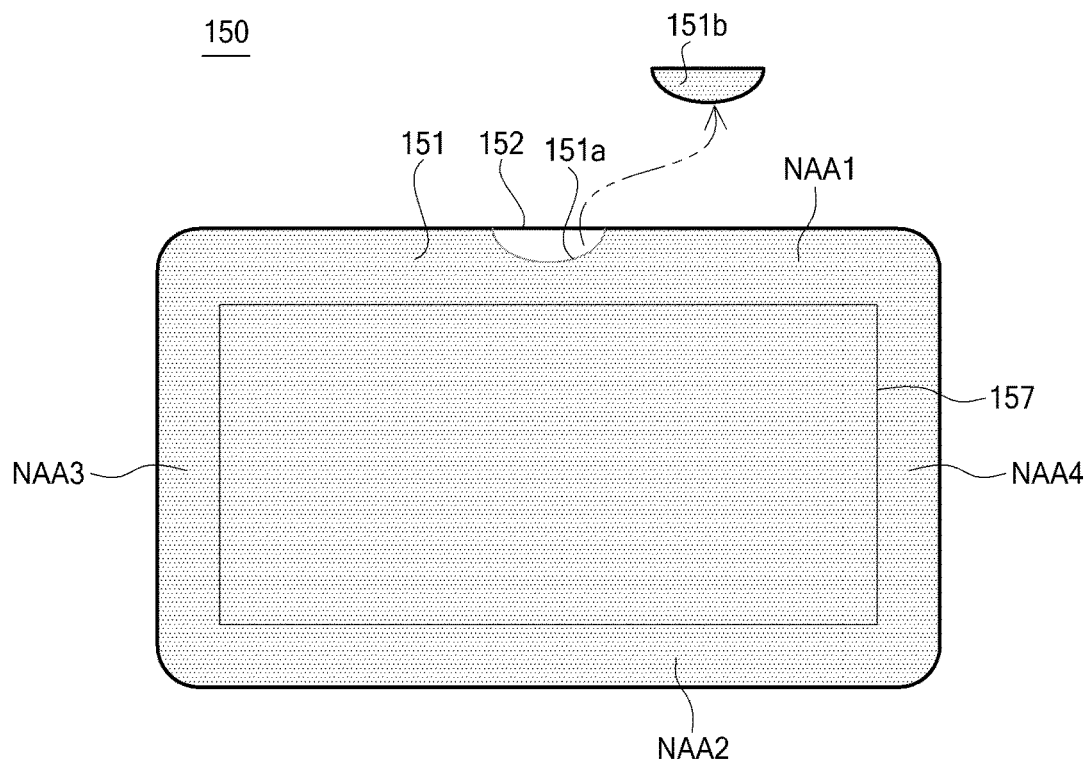
FIG. 4 is a plan view illustrating a rear surface of a panel configuring a display apparatus according to one embodiment of the present invention.
Figure 5:
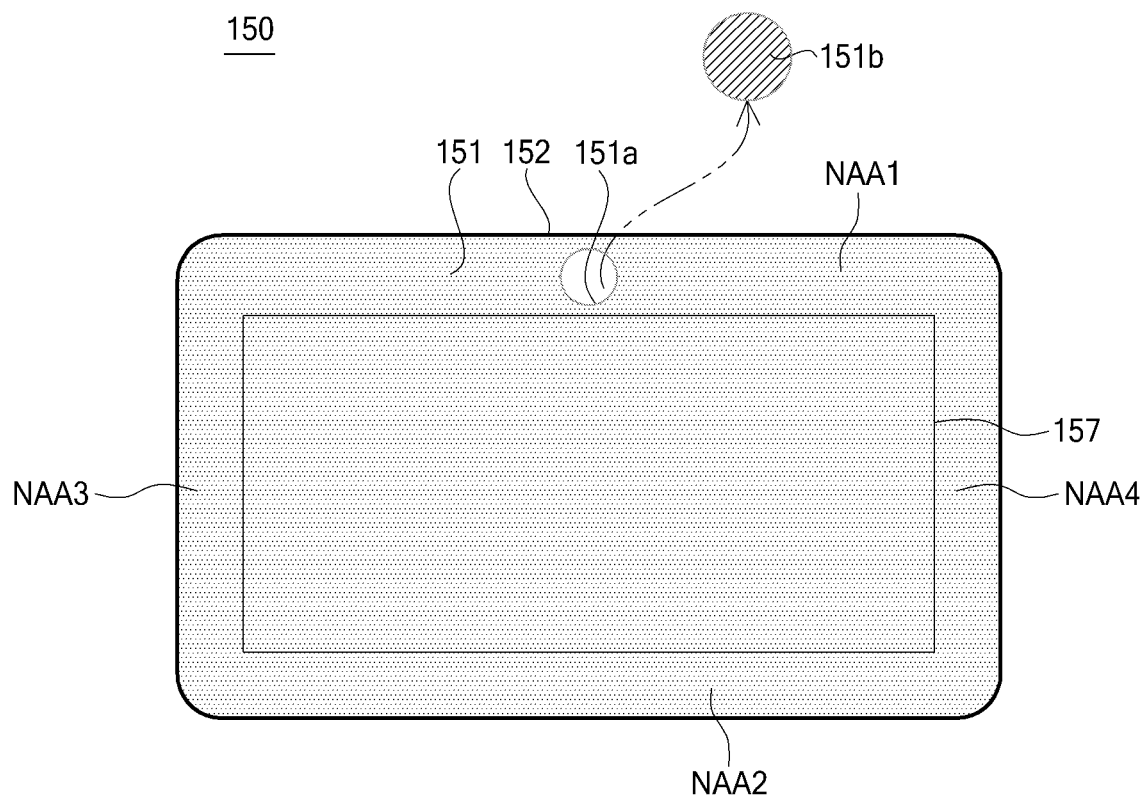
FIG. 5 is a plan view illustrating a rear surface of a panel configuring a display apparatus according to one embodiment of the present invention.

FIG. 3 is an exploded perspective view of an exemplary display apparatus according to an embodiment of the present invention. FIG. 4 is a plan view illustrating a rear surface of a panel in a display apparatus according to an embodiment of the present invention. FIG. 5 is a plan view illustrating a rear surface of a panel in a display apparatus according to another embodiment of the present invention. FIGS. 4 and 5 are plan views of the panel 150 showing the rear side of a panel 150 (i.e., rear surface of a lower substrate 151 of the panel 150).

In FIG. 3, the display apparatus 100 with an LCD panel is illustrated as an example. Although the invention is described in relation to a display apparatus with LCD panel, it should be appreciated that various other kinds of display panels, including an organic light emitting display panel, an electrophoretic display panel and the likes can be used in the display apparatus 100.

When the display apparatus 100 is an LCD apparatus, the display apparatus 100 may further include backlight unit 190, which is disposed in a rear direction of the panel 150 and irradiates light in a direction vertical to the panel 150. The display apparatus 100 may also include a guide panel 110 that supports the panel 150 and the backlight unit 190. The backlight unit 190 may include a light guide panel 120 and a light source 180 that is disposed on a side surface of the light guide panel 120. The light source 180 may be configured to project light onto the side surface of the light guide panel 120. Further, an optical sheet part 130 including a plurality of optical films may be interposed between the light guide panel 120 and the panel 150.

The panel 150 of the display apparatus 100 includes a lower substrate 151 and an upper substrate 152. A plurality of gate lines (not shown) and a plurality of data lines (not shown) are disposed on the lower substrate 151, defining a plurality of pixel areas of the panel 150. The upper substrate 152 is arranged to at least partially overlap the lower substrate 151. The lower substrate 151 is provided with a notch 151A, which is provided by removing a part of the lower substrate 151 that corresponds to the component disposition area where a component of the device or a component of the display apparatus 100 is positioned. A component 160 is arranged to correspond to the notch 151A of the lower substrate 151. That is, the component 160 at the component disposition area is at least partially inserted into the notch 151A or otherwise accommodated by the notch 151A in the lower substrate 151 of the panel 150.

The upper substrate 152 and the lower substrate 151 may each be formed of glass, plastic, metal, and/or the like, and the panel 100 may be manufactured by bonding the lower substrate 151 and the upper substrate 152 by using a seal. The upper substrate 152 may be bonded to the lower substrate 151 by a seal. One or more intermediate layers may be disposed between the lower substrate 151 and the upper substrate 152.

The intermediate layer may be changed in structure depending on the kind of the display apparatus 100 according to an embodiment of the present invention. For example, when the display apparatus 100 according to an embodiment of the present invention is an LCD apparatus, the intermediate layer may include liquid crystal. Also, an alignment layer for aligning liquid crystal molecules in a certain direction may be disposed between the lower substrate 151 and the upper substrate 152. When the display apparatus 100 according to an embodiment of the present invention is an organic light emitting display apparatus, the intermediate layer may include an organic emission layer emitting light and/or the like. When the display apparatus 100 according to an embodiment of the present invention is an electrophoretic display apparatus, the intermediate layer may include e-ink light and/or the like.

A plurality of thin film transistors (TFTs) is provided on the lower substrate 151. Also, a plurality of pixel electrodes and a plurality of common electrodes can be provided on the lower substrate (a TFT substrate) of the panel 100 to control liquid crystal molecules of the plurality of pixels.

A black matrix (BM), a color filter (CF), and/or the like may be disposed on an upper substrate (a CF substrate) of the panel 100.

A polarizing film may be attached to at least one of a bottom of the lower substrate 151 and a top of the upper substrate 152. In other words, the polarizing film may not be attached on either one of the lower substrate 151 and the upper substrate 152.

A pixel element is disposed in each of the plurality of pixel areas defined by intersections of the gate lines and the data lines. The area of the panel 150 where an array of pixels are placed to display images is referred to as a display area 157.

The guide panel 110 may support the backlight unit 190 and the panel 150. The backlight unit 190 may be disposed between the guide panel 110 and the panel 150 to emit light toward the bottom of the panel 150.

As described above, the backlight unit 190 may be configured with the light guide panel 120, the optical sheet part 130, a reflective sheet (not shown) and the light source 180. For example, a reflector (not shown) may be stacked on an internal lowermost end of the guide panel 110, and the light guide panel 120, the optical sheet part 130, and the panel 150 may be sequentially stacked on the reflector.

In an edge type LCD apparatus, the light source 180 can be disposed on one or more inner side surfaces of the guide panel 110 as shown in FIG. 3. That is, the light source 180 may be disposed between a side surface of the guide panel 110 and one of four side surfaces except a top and a bottom of the light guide panel 120, which are adjacent to the optical sheet part 130 and the reflector, among surfaces of the light guide panel 120. In a local (direct) type LCD apparatus, a plurality of light sources 180 may be disposed between the bottom of the panel 150 and a top of the guide panel 110.

The part of the panel excluding the display area 157 can be referred to as a non-display area NAA. Pixels are not provided in the non-display area NAA.

The display area 157 may be surrounded by a non-display area. For clearer explanation, the non-display area next to each of the four sides of the rectangular display area 157 can be referred to as non-display area NAA1 to NAA4. It should be noted that the shape of the display area 157 is not limited to the rectangular shape as shown in FIGS. 3, 4 and 5. The display area 157 can be provided in various other shapes, for instance circular, oval, square, triangle and more, with the non-display area NAA surrounding the display area 157. It should also be noted that the size (e.g., width) of the non-display area NAA next to one side of the display area 157 can differ from size of the non-display area NAA next to another side of the display area 157.

The upper substrate 152 and the lower substrate 151 may be sealed by the seal which is disposed outside the upper substrate 152 and the lower substrate 151. The liquid crystal may be filled into the display area 157 sealed by the seal, and may not be filled into the non-display area NAA disposed outside the display area 157. However, the liquid crystal may be filled into a portion of the non-display area NAA.

As described above, one or more components of the device or the display apparatus 100 is disposed in the component disposition area, and a part of the lower substrate 151 corresponding to the component disposition area can be removed. In other words, the part of the lower substrate 151 over a component is removed to provide a notch 151A in the lower substrate 151 such that the component or the structure for holding the component is at least partially inserted into the notch 151A and protruded toward the upper substrate 152.

To provide an additional description, in the panel 150 according to an embodiment of the present invention, as illustrated in FIGS. 4 and 5, a component disposition area of the lower substrate 151 facing a camera module may be removed. The component disposition area of the lower substrate 151 that is separated from the remaining lower substrate 151 may be referred to as a notched fragment 151B. A portion which is left after the component disposition area is removed in the lower substrate 151 may be referred to as the notch 151A.

The lower substrate 151 may be bonded to the upper substrate 152 by the seal, and then, the notch 151A may be provided by cutting the lower substrate 151 by a laser or a drill. In FIGS. 4 and 5, the notched fragment 151B which is cut and separated from the component disposition area and the notch 151A from which the notched fragment 151B is removed are illustrated.

The notch 151A of the lower substrate 151 provides access to the lower surface of the upper substrate 152, such that the component, in this case a camera, placed in the notch 151A can receive light through the transparent camera hole area of the upper substrate 152. The size of the notch 151A can be formed large enough to accommodate the structure of the guide panel 110 that holds the camera in place. In other words, some part of the guide panel 110 securing the position of the component can also be inserted into the notch 151A and protrude toward the upper substrate 152.

In the embodiment shown in FIG. 4, the notch 151A is formed at the edge of the lower substrate 151. In this case, the notch 151A is formed from the outermost portion of the non-display area NAA1 to the display area 157. In FIG. 4, the notch 151A has a semi-circular shape. However, the shape of the notch 151A is not particularly limited, and the notch 151A can be provided in various shapes.

In the embodiment shown in FIG. 5, the notch 151A is formed in the non-display area NAA1 as a hole, which is distanced away from the edge of the lower substrate 151.

The notch 151A may be provided in a circular shape, but is not limited thereto. In other embodiments, the notch 151A may be provided in various other shapes such as triangle shape, rectangular shape, oval shapes, etc. The shape of the notch 151A largely depends on the tool and the method used in forming the notch 151A. A drill may be used to form a notch 151A with a rounded shape. The notch 151A applied to the panel and the display apparatus according to the first and second embodiments of the present invention may be formed by a laser or a drill. A notch 151A of various shapes can be formed by using a drill, though the corners of the shape may not be as acute or pointed as the one formed by a laser.

Figure 6A:
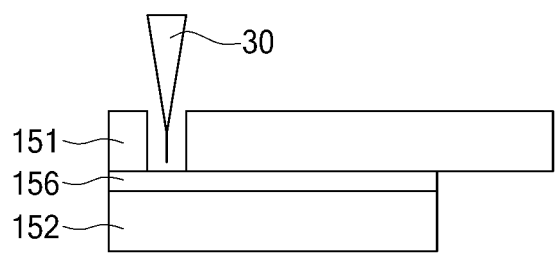
FIGS. 6A, 6B and 6C are a schematic illustration for explaining a method of forming a notch in a display apparatus by using a laser according to an embodiment of the present invention.
Figure 6B:
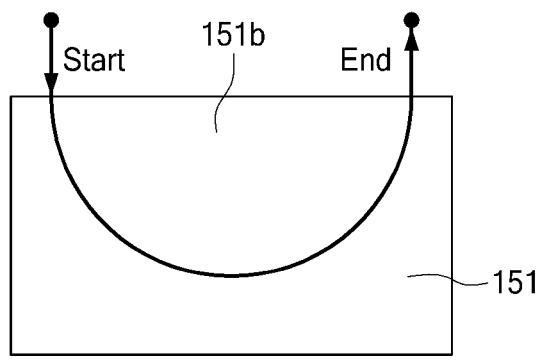
Figure 6C:
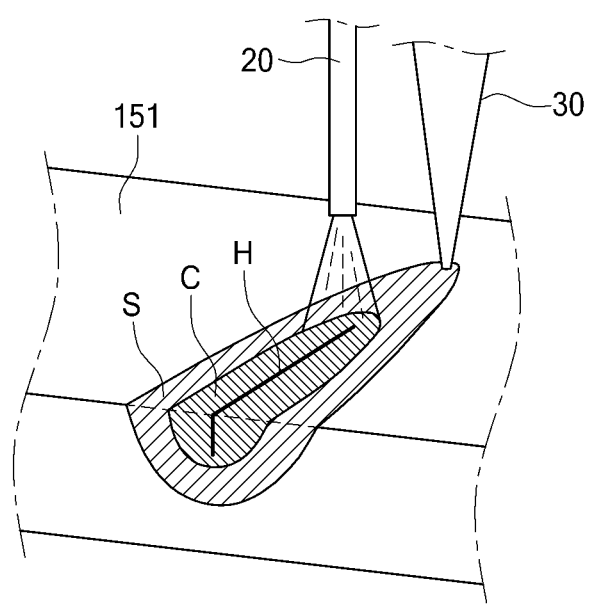

FIGS. 6A, 6B and 6C are exemplary diagram for describing a method of forming a notch with a laser.

Referring to FIG. 6A, a laser 30 can be irradiated from the lower substrate side to cut away the component disposition area of the lower substrate 151. The black matrix 156 may be disposed at a portion of the upper substrate 152 corresponding to the component disposition area. In this case, an intensity of the layer 30 may be controlled so that the black matrix 156, and more importantly the upper substrate 15, are not removed. Subsequently, the laser 30 may cut away the component disposition area along a shape of the component disposition area from an end of the lower substrate 151, namely, an outermost portion of the non-display area, thereby forming the notch 151A as depicted in FIG. 6B. Here, the notch 151A may be connected to the end of the lower substrate 151.

When forming the notch 151A, the area of the lower substrate 151 that is being irradiated with the laser 30 may be cooled by a cooler 20. The cooler 20 may spray gas or liquid to cool the area near the portion that is heated by the laser 30. In FIG. 6C, the cut line where the laser 30 is irradiated is denoted as "H". "S" denotes the area heated by the laser 30 irradiated along the cut line "H". The area immediately next to the cut line H, which is cooled by the cooler 20, is denoted with "C". To provide an additional description, according to the present embodiment, the lower substrate 151 may be expanded and contracted by simultaneously using the laser 30 and the cooler 20, and thus, the component disposition area of the lower substrate 151 may be cut along the cut line H.

A method of manufacturing a display apparatus with a notch, using the above-described laser process, is described below.

First, the lower substrate 151, where the plurality of pixels are respectively provided in the plurality of areas defined by intersections of the plurality of gate lines (not shown) and the plurality of data lines (not shown), and the upper substrate 152 covering the lower substrate 151 may be manufactured.

Second, the notch 151A may be formed by removing a portion of the non-display area disposed outside the display area 157 displaying an image in the lower substrate 151.

A process of forming the notch 151A may include the processes described above with reference to FIGS. 6A, 6B and 6C.

For example, an operation of forming the notch 151A may include: an operation of cutting the component disposition area disposed at a position of the lower substrate 151 facing the component by using the laser 30; and an operation of absorbing the component disposition area of the lower substrate 151 cut by the laser 30 to separate the component disposition area from the panel 150, thereby forming the notch 151A.

In some embodiments, the cut area may be cooled by the cooler 20 after the component disposition area is cut by the laser 30. In some other embodiments, the cutting process and the cooling process may be simultaneously performed.

After the cutting process, the component disposition area may be detached from the remaining lower substrate 151 by using an adhesive tape or by using an air suction means.

Third, when the notch 151A is formed, the panel 150 may be disposed in the guide panel 110 supporting the panel 150 so that the component 160 disposed at a position facing the notch 151A is inserted into the notch 151A. However, in a display apparatus requiring no guide panel 110, the component 160 may be separately inserted into the notch 151A.

FIGS. 7A, 7B, 7C, 7D, 8A, 8B and 8C are exemplary diagrams describing a method of forming a circular shaped notch 151A. In this case, a depth of the lower substrate 151 processed by the drill 40 is adjusted accordingly to minimize damages to the black matrix 156 around the notch 151A and the upper substrate 152.

Particularly, in the present embodiment, an operation of processing the lower substrate 151 may use a cylinder-shaped drill. More specifically, the drill may have a cylindrical shape with a cavity provided at the circular bottom end of the drill. The circular bottom end of the cylindrical drill may be pressed onto the lower substrate while spinning to grind the lower substrate 151.

A processing process using the drill 40 may be performed in order for the notched fragment 151B not to be completely separated from the lower substrate 151. As illustrated in (C) of FIG. 7, the notched fragment 151B may still be connected to the lower substrate 151 by the connection part 151C.

One or more rounds of drilling processes may be performed to form the notch 151. Drills of different sizes may be used in different rounds of drilling process. The connection part 151C may be remain even after multiple rounds of drilling processes. Accordingly, in other embodiments, the connection part 151C may be formed by using two or more drills 40 having different sizes. That is, a cutting process using the drill 40 may be performed twice or more by using a plurality of drills having different sizes.

Subsequently, the notched fragment 151B and the connection part 151C may be detached from the lower substrate 151 by using an air suction/blow means 50.

Figure 7A:
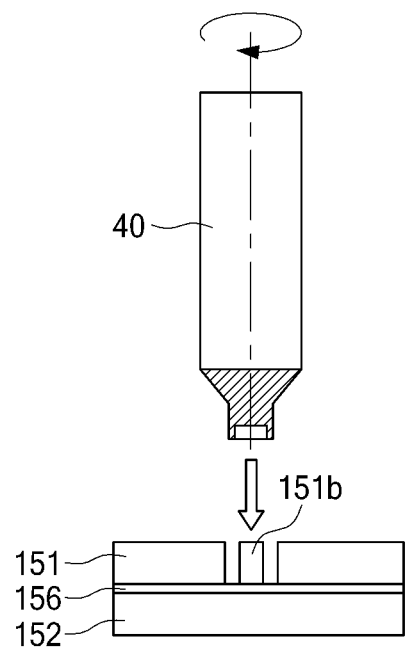
FIGS. 7A, 7B, 7C, 7D, 8A, 8B and 8C are schematic illustrations for explaining a method of forming a notch in a display apparatus by using a drill according to an embodiment of the present invention.
Figure 7B:
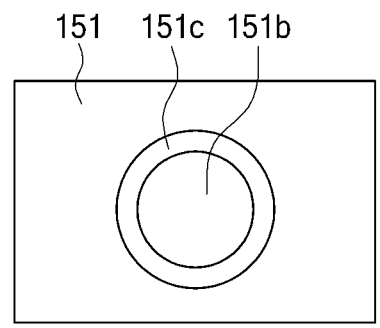
Figure 7C:
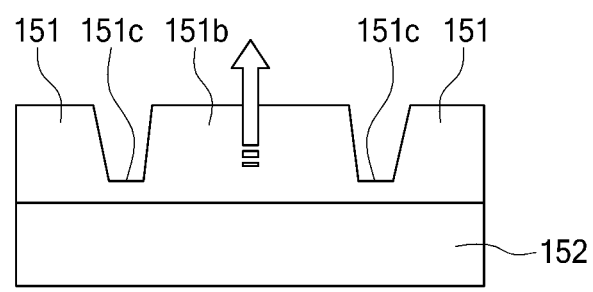
Figure 7D:
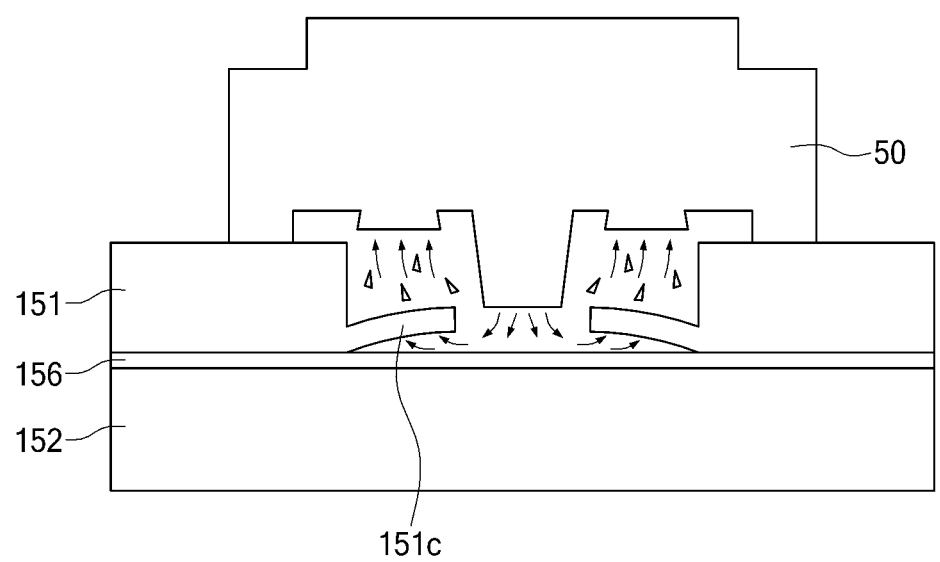

Particularly, in order to pull the connection part 151C, the air suction/blow means 50 may inject air into the space where the fragment 151B is removed. The air injected into the space may be transferred to a lower end of the connection part 151C to partially detach the connection part 151C from the lower substrate 151. The connection part 151C which is partially detached from the lower substrate 151 by the air injected into the space may be sucked-in by the air suction/blow means 50 as depicted in FIG. 7D.

Figure 8A:
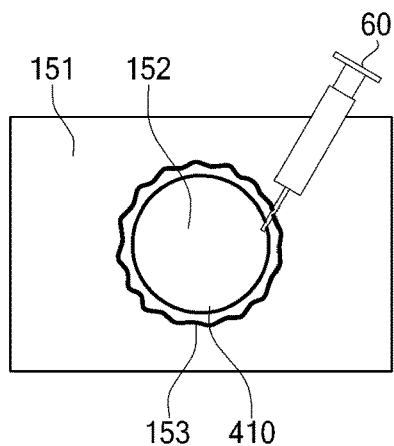

As shown in FIG. 8A, burr and fine cracks that may be formed in the surrounding area 153 of the drilled area on the surface of the lower substrate 151, hampers the integrity of the panel 150.

Figure 8B:
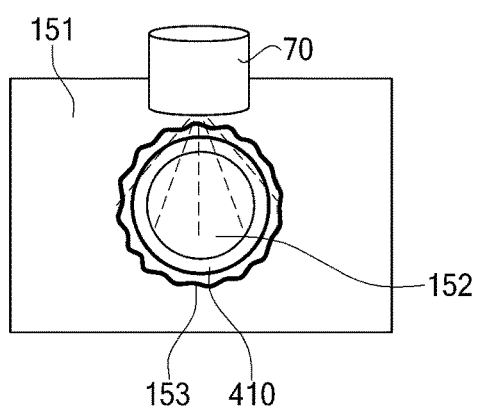

To solve such a defect, a restoring agent 410 may be dispensed along the cut line as illustrated in FIG. 8A. In this regard, an injector 60 may be used to inject the restoring agent 410 into the processing surface, and the restoring agent 410 may be cured by a curer 70 as illustrated in FIG. 8B. The restoring agent 410 may acryl-based resin, epoxy and the like, which is capable of being thermally or optically cured using a curer 70.

Another round of a drilling process can be performed after curing the restoring agent 410 dispensed around the cut line to provide a notch 151A having a smoother surface.

A method of manufacturing a display apparatus according to a second embodiment of the present invention, which includes the above-described drill process, will be described below.

First, the lower substrate 151, where the plurality of pixels are respectively provided in the plurality of areas defined by intersections of the plurality of gate lines (not shown) and the plurality of data lines (not shown), and the upper substrate 152 covering the lower substrate 151 may be manufactured. A process of manufacturing the panel 150 is generally used, and thus, its detailed description is not provided.

Second, the notch 151A may be formed by removing a portion of the non-display area disposed outside the display area 157 displaying an image in the lower substrate 151.

For example, an operation of forming the notch 151A may include: an operation of cutting the component disposition area disposed at a position of the lower substrate 151 facing the component by using the drill 40; and an operation of adsorbing, by using the air suction/blow means 50, the component disposition area of the lower substrate 151 cut by the drill 40 to separate the component disposition area from the panel 150, thereby forming the notch 151A.

Particularly, in the operation of cutting the component disposition area by using the drill 40, the component disposition area of the lower substrate 151 may be cut in a circular shape by using a cylinder-shaped drill, and the component disposition area may be cut in order for the notched fragment 151B having a cylindrical shape not to be separated from the lower substrate 151.

In this case, the operation of adsorbing the component disposition area to form the notch 151A may include an operation of adsorbing the notched fragment 151B connected to the lower substrate 151 to expose the notch 151A; an operation of spraying air to the notch 151A to partially detach the connection part 151C, which is left in the notch 151, from the lower substrate 151; and an operation of adsorbing the connection part 151C, which is partially detached from the lower substrate 151 by spraying the air, to separate the component disposition area from the panel 150.

Figure 8C:
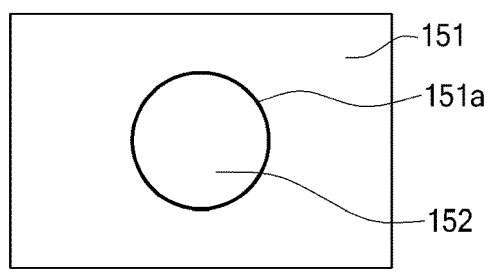

Moreover, an operation of injecting a restoring agent into an inner circumference surface of the notch 151A as illustrated in FIG. 8A may include an operation of curing the restoring agent as illustrated in FIG. 8B; and an operation of polishing the cured restoring agent to form the notch 151A as illustrated in FIG. 8C.

When the notch 151A has been formed, a component 160 which is disposed at a position facing the notch 151A may be disposed at the notch 151A. In this case, a portion of the guide panel 110 supporting the component 160 may be inserted into and disposed at the notch 151A.

Figure 9:
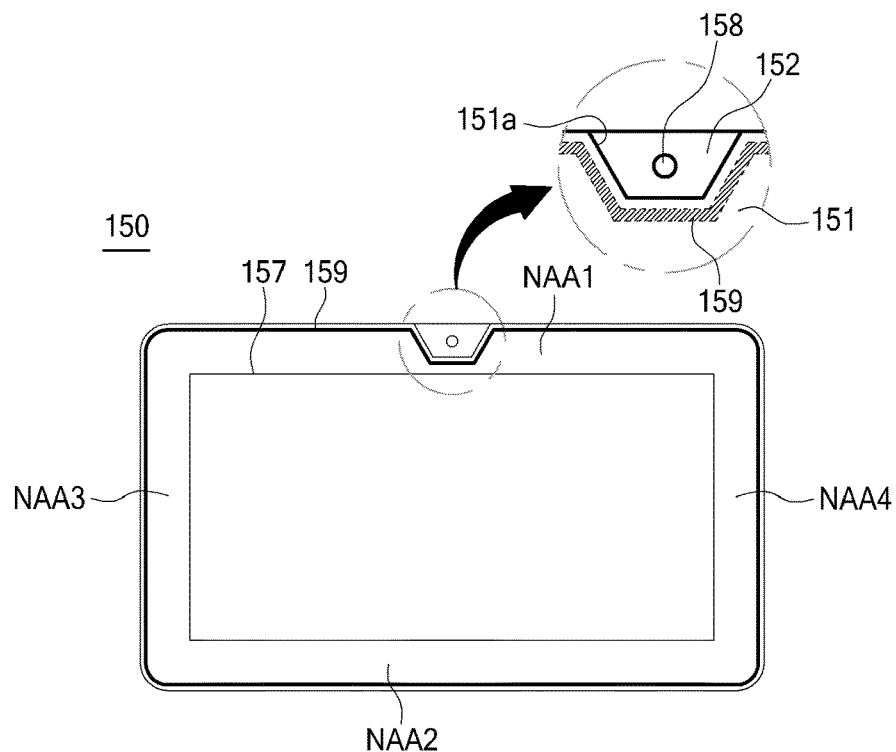
FIGS. 9-11 are schematic illustrations showing configurations of a sealing pattern in a non-display area of a panel according to embodiments of the present invention.
Figure 10:
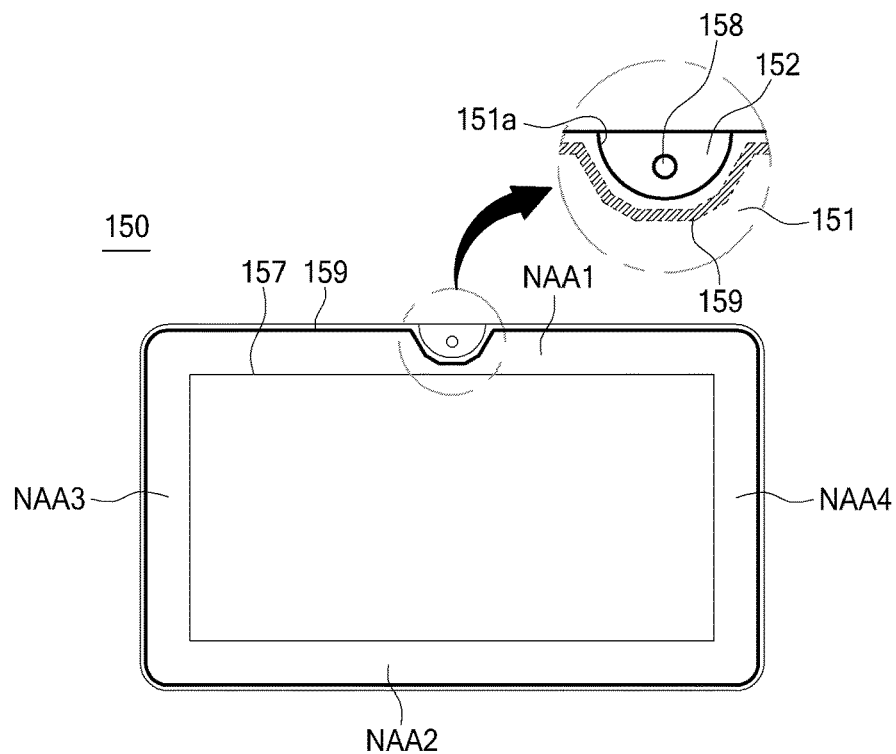
Figure 11:
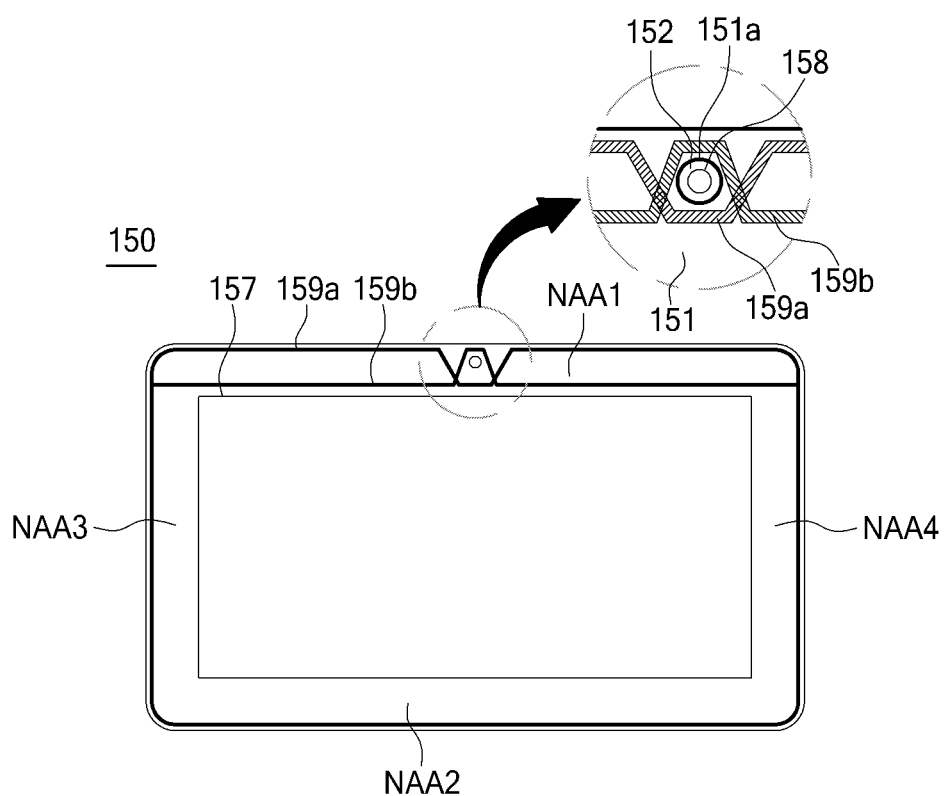

FIGS. 9, 10 and 11, each illustrate an arrangement of a sealant between the lower substrate 151 and the upper substrate 152 for bonding them together into a panel 150. The seal path, where the sealant is dispensed, is provide in the non-display area of a panel. When the component 160 is a camera, a camera hole 158 may be provided in the upper substrate 152 at the area corresponding to the camera (i.e., the component 160). The black matrix on the upper substrate 152 is removed at the area corresponding to the camera hole 158 so that the external light can pass through the upper substrate 152 to reach the camera positioned at the notch 151A of the lower substrate 151.

In FIGS. 9 and 10, the notch 151A may be connected to the end of the lower substrate 151. The upper substrate 152 and the lower substrate 151 may be sealed and bonded by the seal path 159 that is dispensed between those two substrates. The shape of the seal path may vary depending on the shape of the notch 151A. In FIGS. 9 and 10, the notch 151A is formed from the outer edge of the lower substrate 151. In such cases, the notch 151A is continuously linked from the outer edge of the lower substrate 151, and thus the outline of the lower substrate 151 is partly shaped by the notch 151A. Since the lower substrate 151 has the notch 151A, the seal path may substantially follow along the outline of the lower substrate 151. As such, the notch 151A is positioned outside the seal path. For example, the notch 151A and the seal path 159 may each be formed in an angled semicircular shape as illustrated in FIG. 9, or may be formed in a rounded semi-circular shape as illustrated in FIG. 10, such that the region contained within the seal path is separated from the notch 151A positioned outside the seal path.

In FIG. 11, the notch 151A is provided as an isolated notched region (e.g., isolated hole) within the non-display area of the panel 150. In such cases, the seal path 159 may be provided around the notch 151A to improve strength and integrity of the panel 150 at the notch 151A.

Although the notch 151A is depicted as having a circular shape in FIG. 11, the shape of the notch 151A may vary in other embodiments. Thus, the shape of the seal path 159 surrounding the notch 151A may also vary based on the shape of the notch 151A, albeit the shape of the seal path 159 surrounding the notch 151A needs not be identical to the shape of the notch 151A. For instance, the seal path 159 that surrounds the notch 151A may be in a triangle shape, a hexagonal shape, an octagonal shape and the like, though the notch 151A that is surrounded by the seal path 159 may be in a circular shape.

In some embodiments, multiple seal paths can be provided in the non-display area where the notch 151A is provided. Referring to FIG. 11, a seal path 159 divides into two separate paths 159A and 159B, each being arranged to go around opposite sides of the notch 151A from the other. The seal path 159A and the seal path 159B can be arranged to interweave around the notch 151A such that the notch 151A is positioned between the two crossing points of the seal paths 159A and 159B. More specifically, a portion of the seal path 159A is disposed around one side of the notch 151A, and a portion of the seal path 159B is disposed around the other side of the notch 151A. The seal paths 159A and 159B intersect each other to surround the notch 151A as shown in FIG. 11.

As shown in FIG. 11, the notch 151A and the seal path 159 may be formed in a different shape from each other. In some embodiments, however, the portion of seal path 159A and the portion of the seal path 159B surrounding the notch 151A may form a shape corresponding to the shape of the notch 151A.

The portion of the upper substrate 152 corresponding to the notch 151A of the lower substrate 151 may be exposed through the notch 151A. A dam or other structures for suppressing the seal path 159 from leaking into the notch 151A may be provided along the notch 151A. Accordingly, the dam between the lower substrate 151 and the upper substrate 152 may be arranged to surround the notch 151A. For instance, a dam having a ring shape may be provided so that a circular notch 151A, which is depicted in FIG. 11, is contained within the dam.

In some embodiments, multiple dam structures may be used for tight seal around the notch 151A. For instance, two different ring shaped dams, each having different sizes, may be arranged to surround the notch 151A. The larger ring may surround the smaller ring, which surrounds the notch 151A. In other words, the notch 151A can be contained in the smaller ring (i.e., first dam), which is also contained in the larger ring (i.e., second dam). Such a dam structure may be formed of resinous material curable by ultraviolet light and/or by heat. Also, in some embodiments, the dam may be formed of the same material as the column spacer, maintaining the space between the lower substrate 151 and the upper substrate 152.

To this end, the method of manufacturing the display apparatus with the notched lower substrate can include: an operation of manufacturing the lower substrate 151; an operation of manufacturing the upper substrate 152; an operation of dispensing the sealant along the seal path 159 on at least one of the lower substrate 151 and the upper substrate 152 to surround the notch 151A which is disposed at a certain position of the panel 150 facing the component (for example, a camera); and an operation of bonding the lower substrate 151 to the upper substrate 152.

Moreover, the operation of coating the seal path 159 may include: an operation of dispensing the sealant along a first seal path 159A, which is bent in a direction from an end of the non-display area to the display area to surround the component disposition area, on at least one of the lower substrate 151 and the upper substrate 152; and an operation of dispensing the sealant along a second seal path 159B, which is bent in a direction from a portion adjacent to the display area to the end of the non-display area and intersects the first seal path 159A at an external position of the component disposition area, on at least one of the lower substrate 151 and the upper substrate 152.

Therefore, the notch 151A may be surrounded by the first seal path 159A, which is bent in the direction from the end of the non-display area to the display area 157 to surround the component disposition area, and the second seal path 159B which is bent in the direction from the portion adjacent to the display area 157 to the end of the non-display area and intersects the first seal path 159A at an external position of the component disposition area. Further, as described above, the method may further includes an operation for forming one or more dam structures around the notch 151A. Therefore, integrity around the notch 151A can be improved.

Figure 12:
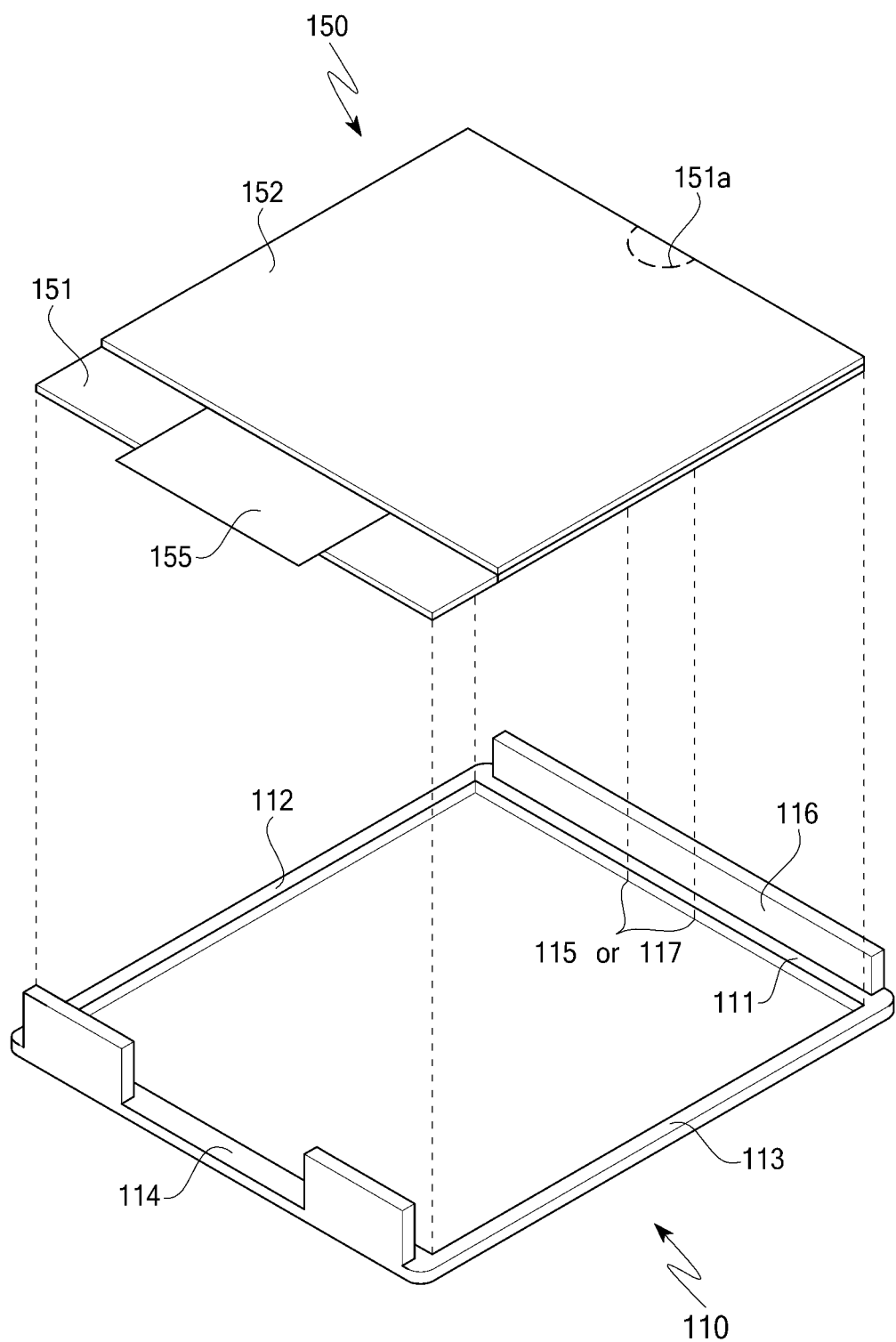
FIG. 12 is an exploded perspective view illustrating an exemplary panel and an exemplary guide panel of a display apparatus according to an embodiment of the present invention.
Figure 13:
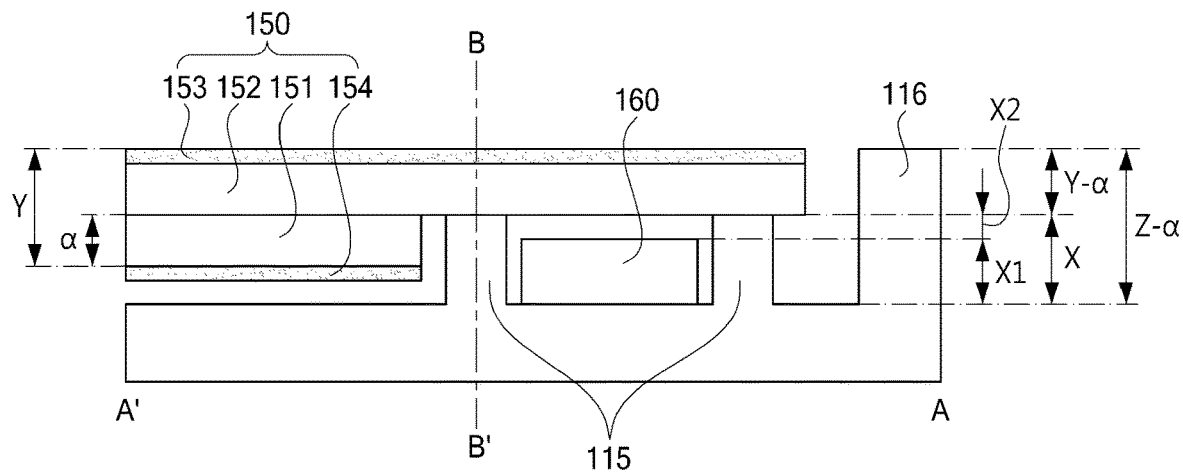
FIG. 13 is a schematic illustration of a cross-sectional view of a display apparatus, which is taken along line A-A' denoted in FIG. 2 according to an embodiment of the present invention.
Figure 14:
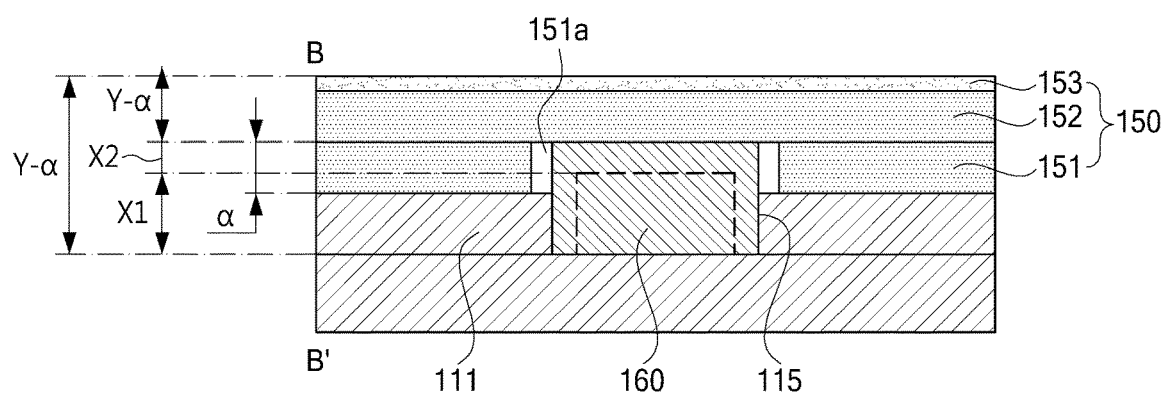
FIG. 14 is a cross-sectional view of a display apparatus, which is taken along line B-B' denoted in FIG. 13.
Figure 15:
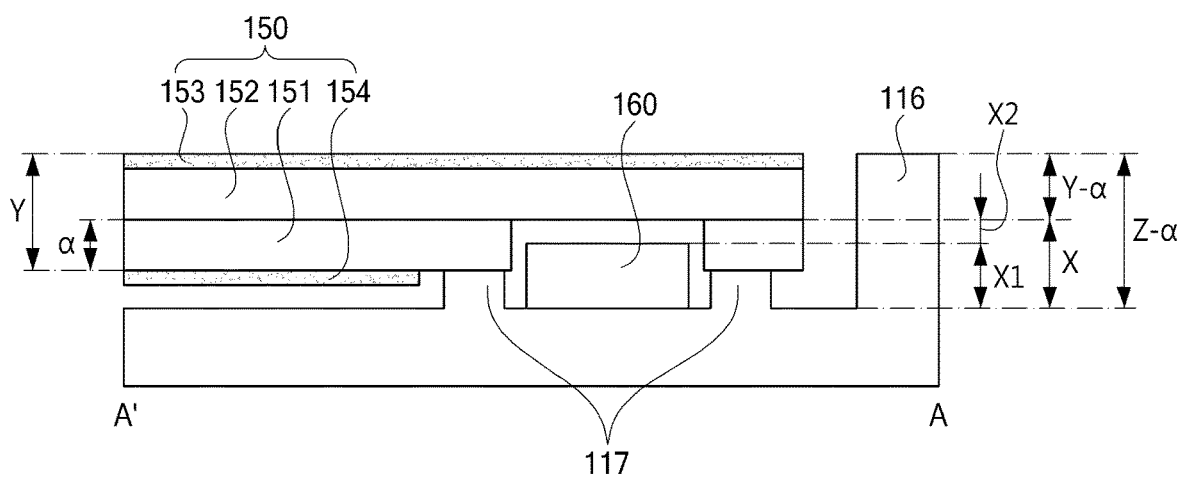
FIG. 15 is a cross-sectional view of a display apparatus, which is taken along line A-A' denoted in FIG. 2 according to an embodiment of the present invention.

FIG. 12 is an exploded perspective view illustrating a panel and a guide panel which configure a display apparatus according to an embodiment of the present invention. FIG. 13 is an exemplary diagram illustrating a cross-sectional view taken along line A-A' of FIG. 2 in the display apparatus in which the component 160 is built-in. In FIG. 13, the set cover 10 is not illustrated. FIG. 14 is an exemplary diagram illustrating a cross-sectional view taken along line B-B' of FIG. 13 in the display apparatus according to the first embodiment of the present invention, and is a cross-sectional view of the display apparatus of FIG. 13 when seen from a left direction of FIG. 13. FIG. 15 is an exemplary diagram illustrating a cross-sectional view taken along line A-A' of FIG. 2 in the display apparatus according to another embodiment of the present invention in which the component 160 is built in.

As described above, the guide panel 110 may support the panel 150, and an upper substrate supporting part 115 accommodating the camera 160 may be provided in the guide panel 110. However, in the display apparatus according to the present embodiment, the guide panel 110 may be omitted.

The light guide panel 120 and the panel 150 can be supported by the guide panel 110.

The guide panel 110, as illustrated in FIGS. 3 and 12, may be implemented as a frame. The reflector, the light guide panel 120, the optical sheet part 130, and the panel 150 may be respectively fixed to certain positions in reference to the guide panel 110.

The light source 180 may be fixed to one side surface of the guide panel 110.

The guide panel 110, as illustrated in FIG. 12, may include a first supporting part 111 that supports a first non-display part of the non-display area, the upper substrate supporting part 115 that is disposed at the first supporting part 111, a second supporting part 112 that is connected to one side end of the first supporting part 111 to support a second non-display part of the non-display area, a third supporting part 113 that is connected to the other side end of the first supporting part 111 to support a third non-display part of the non-display area, and a fourth supporting part 114 that is connected to the second supporting part 112 and the third supporting part 113 to face the first supporting part 111. Also, an upper end supporting part 116 for guiding a side surface of an upper end of the panel 150 in a direction toward the first supporting part 111 may be provided in the guide panel 110, and a lower end supporting part may be provided at the fourth supporting part 114 to face the upper end supporting part 116.

As described above, the non-display area may be provided in various shapes. Hereinafter, however, for convenience of description, a case where the non-display area is disposed outside the display area having a tetragonal shape will be described as an example of the present invention. In this case, the non-display area may be divided into the first to fourth non-display parts NAA1 to NAA4, as illustrated in FIGS. 4 and 5.

Here, the upper substrate supporting part 115 may denote a region of the guide panel 110 which can be inserted into the notch 151A. The lower substrate supporting part 117 may denote a region of the guide panel 110 which supports the lower substrate 151 at an external position of the notch 151A. Therefore, the lower substrate supporting part 117 may include the first to fourth supporting parts 111 to 114.

Here, the height of the upper substrate supporting part 115 may be higher than that of each of the first to fourth supporting parts 111 to 114, supporting the non-display area of the panel 150 except the notch 151A, in the guide panel 110.

To provide an additional description, a height of the upper substrate supporting part 115 may be higher than that of each of the first to fourth supporting parts 111 to 114.

In this case, the upper substrate 152 exposed through the notch 151A may be disposed at the upper substrate supporting part 115, and the lower substrate 151 may be disposed at the lower substrate supporting parts 111 to 114 and 117 except the upper substrate supporting part 115 in the guide panel 110.

Moreover, a height of each of the lower substrate supporting parts 111 to 114 except the upper substrate supporting part 115 in the guide panel 110 may be less than that of the upper substrate supporting part 115 by a thickness of the lower substrate 151.

As shown in FIGS. 13 and 14, a part of the guide panel 110 (e.g., the upper substrate supporting part 115) may be inserted into the notch 151A to support the upper substrate 152. As shown in FIG. 15, a part of the guide panel 110 (e.g., the lower substrate supporting part 117) may support the lower substrate 151 at an external position of the notch 151A without being inserted into the notch 151A.

To provide an additional description, the upper substrate supporting part 115 may be an area that surrounds the component 160, and may be inserted into the notch 151A to support the upper substrate 152. However, the area surrounding the component 160 may not be inserted into the notch 151A. If the area surrounding the component 160 is not inserted into the notch 151A, the upper substrate supporting part 151 may support the lower substrate 151. In this case, the area surrounding the component 160 may become the lower substrate supporting part 151.

The portion of the guide panel 110 that surrounds the component 160, which is inserted into the notch 151A, may be referred to as the upper substrate supporting part 115. On the other hand, the portion of the guide panel 110 surrounding the component 160, which does not supports the upper substrate 151 through the notch 151A of the lower substrate 151 may be referred to as the lower substrate supporting part 117.

FIGS. 13 and 14, the guide panel 110 applied to the display apparatus according to the first embodiment of the present invention is illustrated. However, the guide panel 110 illustrated in FIGS. 13 and 14 may be applied to the display apparatus according to the second embodiment of the present invention. Also, hereinafter, an LCD apparatus will be described as an example of the present invention.

Referring to FIGS. 13 and 14, the upper substrate supporting part 115 may fix the component 160 (for example, the camera 160) not to be moved. To this end, the upper substrate supporting part 115 may surround the camera 160 and provide a space for accommodating the camera 160.

The upper substrate supporting part 115 may be provided as a continuous part of the first supporting part 111.

In this case, a height of the upper substrate supporting part 115 may be higher than that of each of the first to fourth supporting parts 111 to 114, supporting the first to fourth non-display parts of the panel 150 except the notch 151A, in the guide panel 110.

That is, a height of the upper substrate supporting part 115 may be higher than that of each of the first to fourth supporting parts 111 to 114.

To provide an additional description, as illustrated in FIGS. 13 and 14, the upper substrate supporting part 115 may be protruded toward the panel 150 at the notch 151A, and surround the camera 160.

The panel 150 may include the lower substrate 151, the upper substrate 152, and a liquid crystal layer that is disposed between the lower substrate 151 and the upper substrate 152 and is filled with liquid crystal. An upper polarizing film 153 and a lower polarizing film 154 may be provided on the opposite sides of the panel 150. It should be noted that these polarizing films 153, 154 may not be provided at the region corresponding to the notch 151A.

The upper substrate 152 and the lower substrate 151 may be sealed by a seal disposed outside the upper substrate 152 and the lower substrate 151. The liquid crystal may be filled into the display area 157 sealed by the seal, but may not be filled into the first to fourth non-display parts disposed outside the display area 157.

For example, in FIG. 13, the camera 160 may be disposed between two upper substrate supporting parts 115, and the two upper substrate supporting parts 115 may support the upper substrate 152 exposed through the notch 151A.

Moreover, in FIG. 14, the camera 160 disposed on an inner side of the upper substrate supporting part 115 is illustrated as a dot line, and the upper substrate supporting part 115 may support the upper substrate 152 exposed through the notch 151A.

The size of the notch 151A may be the same as that of an upper end surface of the upper substrate supporting part 115, but the present embodiment is not limited thereto. In other embodiments, as illustrated in FIG. 14, the size of the notch 151A may be greater than that of the upper end surface of the upper substrate supporting part 115.

To provide an additional description, the upper substrate 152 exposed through the notch 151A may be disposed on the upper substrate supporting part 115, and the lower substrate 151 may be disposed on the first to fourth support parts 111 to 114 except the upper substrate supporting part 115 in the guide panel 110.

In this case, as illustrated in FIGS. 13 and 14, a height "X" of the upper substrate supporting part 115 may be greater than a height "X–$\alpha$" of the first supporting part 111 by a thickness "$\alpha$" of the lower substrate 151.

Moreover, a height of each of the second to fourth supporting parts 112 to 114 may be less than that of the upper substrate supporting part 115 by the thickness "$\alpha$" of the lower substrate 151.

To provide an additional description, a height of each of the first to fourth supporting parts 111 to 114 may be less than the height "X" of the upper substrate supporting part 115 by the thickness "$\alpha$" of the lower substrate 151.

Since the height of each of the first to fourth supporting parts 111 to 114 is less than the height "X" of the upper substrate supporting part 115 by the thickness "$\alpha$" of the lower substrate 151, a thickness of the display apparatus according to the present embodiment may be less than the height "X" of the upper substrate supporting part 115 by the thickness "α" of the lower substrate 151.

Figure 1:
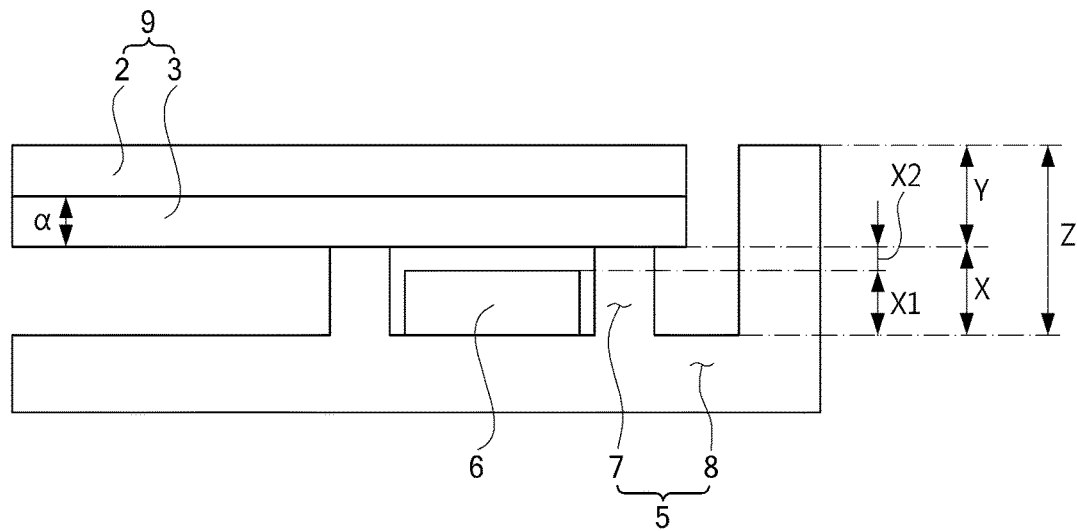
FIG. 1 is a diagram schematically illustrating a cross-sectional view of a display apparatus with a built-in camera of a related art.

For example, in the related art display apparatus illustrated in FIG. 1, all the supporting parts of the guide panel 5 have the same height, and the panel 9 including the lower substrate 3 having the thickness "α" is disposed on the supporting parts.

In this case, a height of the upper substrate supporting part surrounding a periphery of the camera 160 is determined as a height of the camera 160. All the supporting parts and the upper substrate supporting part may have the same height in order for the panel disposed on the supporting parts to be horizontal.

Therefore, the height "Z" of the related art display apparatus illustrated in FIG. 1 is the sum of the thickness "X" of the supporting parts and the height "Y" of the panel which includes the lower substrate 3 and the upper substrate 2. In this case, substantially, an actual height of a side surface of the guide panel 5 is greater than the sum of the thickness "X" of the supporting parts and the height "Y" of the panel so as to surround a side surface of an upper end of the panel 9 and a side surface of a lower end of the panel 9.

However, as illustrated in FIGS. 13 and 14, in the display apparatus according to the present embodiment, the upper substrate 152 exposed through the notch 151A may be disposed on the upper substrate supporting part 115.

The height of the upper substrate supporting part 115 may be set based on the height of the camera 160. Therefore, the height of the upper substrate supporting part 115 may be the same as that of the supporting part 7 applied to the related art display apparatus illustrated in FIG. 1.

In this case, the height of each of the first to fourth supporting parts 111 to 114 may be less than the height of the upper substrate supporting part 115 by the thickness "α" of the lower substrate 151.

Therefore, when the height "Z" of the related art display apparatus illustrated in FIG. 1 is the sum of the height "Y" of the panel 9 including the lower substrate 3 and the upper substrate 2, the height "X1" of the camera 6, and the interval "X2" between the camera 6 and the panel 9, the height of the display apparatus according to the present embodiment may be the sum of the height "Y–α" of the upper substrate 152, a height "X1" of the component 160, and an interval "X2" between the component 160 and the upper substrate 152 as illustrated in FIGS. 13 and 14. In this case, heights of the polarizing films 153 and 154 attached to the panel 150 may not be considered. Also, the sum of the height "X1" of the component 160 and the interval "X2" may be the height of the upper substrate supporting part 115.

That is, a height "Z–α" of the display apparatus according to the present embodiment may not include the thickness "α" of the lower substrate 151 configuring the panel 150. Therefore, the height "Z–α" of the display apparatus according to the present embodiment may have a value which is less than the height "Z" of the related art display apparatus by thickness "α".

Therefore, the display apparatus according to the present embodiment may be manufactured thinner than the relate art display apparatus by the thickness "α" of the lower substrate 151.

Second, in the display apparatus according to the first embodiment of the present invention, as illustrated in FIGS. 13 and 14, the upper substrate supporting part 115 may be inserted into the notch 151A and may support the upper substrate 152.

However, the upper substrate supporting part 115 may not be inserted into the notch 151A. For example, in FIG. 14, the upper substrate supporting part 115 may be omitted.

In this case, the lower substrate 151 may be disposed on the first to fourth supporting parts 111 to 114 having the same height.

Therefore, the height "Z–α" of the display apparatus according to the present embodiment may be the sum of the height "Y–α" of the upper substrate 152, the height "α" of the lower substrate 151, and the height of the first supporting part 111. In FIG. 14, when it is assumed that the upper substrate supporting part 115 is not provided, a height "X" which is the sum of the height "α" of the lower substrate 151 and the height of the first supporting part 111 may be the same as the height "X1" of the component 160 and the interval "X2" between the upper substrate 152 and the component 160.

Therefore, in FIG. 14, if the upper substrate supporting part 115 is not provided, the height of the display apparatus according to the present embodiment may be the sum "Y–α+X=(Y+X)–α=Z–α" of the height "Y–α" of the upper substrate 152, the height "X1" of the component 150, and the interval "X2" between the upper substrate 152 and the component 160.

Therefore, the display apparatus according to the present embodiment may be manufactured thinner than the relate art display apparatus by the thickness "α" of the lower substrate 151.

Third, in the display apparatus according to the second embodiment of the present invention, as described above with reference to FIGS. 13 and 14, the upper substrate supporting part 115 may be inserted into the notch 151A and may support the upper substrate 152.

However, as illustrated in FIG. 15, the upper substrate supporting part 115 may not be inserted into the notch 151A.

In this case, as described in the second example, a height of the display apparatus according to the second embodiment of the present invention may be the sum "Y–α+X=Z–α" of the height "Y–α" of the upper substrate 152, the height "X1" of the component 150, and the interval "X2" between the upper substrate 152 and the component 160.

Therefore, the display apparatus according to the present embodiment may be manufactured thinner than the relate art display apparatus by the thickness "α" of the lower substrate 151.

Moreover, a structure illustrated in FIG. 15 may be applied to the display apparatus according to the first embodiment of the present invention.

To provide an additional description, the thickness "α" of the lower substrate 151 may not be included in the height of the display apparatus according to the present embodiment, and thus, the display apparatus according to the present embodiment may be manufactured thinner than the relate art display apparatus by the thickness "α" of the lower substrate 151.

According to the embodiments of the present invention, the component disposition area facing a component disposed on the lower end of the non-display area of the panel is removed in the lower substrate configuring the panel, and the notch is provided by removing the component disposition area. Also, the component may be inserted into the notch. Accordingly, a thickness of a display apparatus is reduced.

Moreover, according to the embodiments of the present invention, when the component is a camera, light which is input through the upper substrate configuring the panel may be transferred to the camera without passing through the lower substrate, and thus, a recognition rate of the camera is enhanced.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A display apparatus, comprising:
a panel having a lower substrate and an upper substrate at least partially overlapping each other,
the lower substrate including a plurality of pixels respectively provided in a plurality of areas, and
a black matrix between the upper substrate and the lower substrate,
wherein the lower substrate is provided with a notch accommodating a component of the panel,
the upper substrate and the lower substrate are sealed by a seal which is disposed along a seal path between the upper substrate and the lower substrate, and the seal path is configured to surround the notch at a component disposition area,
wherein the seal path includes a first seal path and a second seal path, each being arranged to go around opposite sides of the notch from each other, and wherein the first seal path and the second seal path are interweaved such that the notch is fully enclosed within the component disposition area between two intersecting points of the first seal path and the second seal path,
wherein the two intersecting points are disposed between a the first seal path and the second seal path, wherein segments of the first seal path and segments of the second seal path are parallel with an edge of the panel, and
wherein each of the first seal path and the second seal path, individually, forms a continuous path around the notch, such that the two intersecting points are located, respectively, at two positions set apart from the segments of the first seal path parallel with the edge of the panel and the segments of the second seal path parallel with the edge of the panel.

2. The display apparatus of claim 1, wherein the component is a camera.

3. The display apparatus of claim 1, wherein the component is a driving chip.

4. The display apparatus of claim 2, wherein the notch of the lower substrate is positioned in a non-display area of the panel.

5. The display apparatus of claim 4, wherein the notch is circular in shape.

6. The display apparatus of claim 2, wherein the upper substrate includes a camera hole at an area corresponding to the camera, and wherein the black matrix on the upper substrate is removed at an area corresponding to the camera hole.

7. The display apparatus of claim 1, further comprising a guide panel supporting the panel and the component.

8. The display apparatus of claim 7, wherein a portion of the guide panel supporting the component is inserted into, and disposed at, the notch.

9. The display apparatus of claim 7, wherein a portion of the guide panel supports the lower substrate at an external position of the notch.

* * * * *